(12) United States Patent
Mosher

(10) Patent No.: US 6,521,946 B2
(45) Date of Patent: Feb. 18, 2003

(54) ELECTROSTATIC DISCHARGE RESISTANT EXTENDED DRAIN METAL OXIDE SEMICONDUCTOR TRANSISTOR

(75) Inventor: Dan M. Mosher, Plano, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 09/998,620

(22) Filed: Nov. 30, 2001

(65) Prior Publication Data
US 2002/0074606 A1 Jun. 20, 2002

Related U.S. Application Data

(60) Provisional application No. 60/250,234, filed on Nov. 30, 2000.

(51) Int. Cl.$^7$ .................. H01L 29/76; H01L 29/94; H01L 31/062; H01L 31/113; H01L 31/119
(52) U.S. Cl. .................. 257/336; 257/339; 257/344; 257/355; 257/371; 257/408
(58) Field of Search .................. 257/334, 335, 257/336, 337, 338, 339, 344, 345, 346, 355, 356, 357, 371, 408

(56) References Cited

U.S. PATENT DOCUMENTS

| | | | |
|---|---|---|---|
| 5,306,652 A | | 4/1994 | Kwon et al. |
| 5,406,110 A | | 4/1995 | Kwon et al. |
| 5,627,394 A | | 5/1997 | Chang et al. |
| 5,780,912 A | * | 7/1998 | Burr et al. .................. 257/408 |
| 5,903,032 A | * | 5/1999 | Duvvury .................. 257/355 |
| 6,265,251 B1 | * | 7/2001 | Jun et al. .................. 257/355 |

OTHER PUBLICATIONS

Efland, Taylor, et al., "Self–Aligned Resurf to Locos Region LDMOS Characterization Shows Excellent $R_{sp}$ vs BV Performance," IEEE 0–7803–3106–0, 1996, pp. 147–150.

* cited by examiner

Primary Examiner—David Nelms
Assistant Examiner—Andy Huynh
(74) Attorney, Agent, or Firm—Peter K. McLarty; W. James Brady, III; Frederick J. Telecky, Jr.

(57) ABSTRACT

A semiconductor device comprising a first transistor (40) and a second transistor (100), both formed in a semiconductor substrate (50). The first transistor comprises a gate conductor (56) and a gate insulator (54) separating the gate conductor from a semiconductor material and defining a channel area (66) in the semiconductor material opposite from the gate conductor. The first transistor further comprises a source ($S_2$) comprising a first doped region ($58_1$) of a first conductivity type and adjacent the channel area. Further, the first transistor comprises a drain ($D_2$). The drain comprises a first well ($64_1$) adjacent the channel area and having a first concentration of the first conductivity type and a first doped region portion and a second doped portion (68). The first doped portion has a second concentration of the first conductivity type. The second concentration is greater than the first concentration and the first doped region portion has a common interface with the first well. The second doped region portion has the second concentration of the first conductivity type, wherein the second doped region portion has no common interface with the first well and is not adjacent the channel area. The second transistor (100) comprises a second well ($64_2$) formed using the same implant step as the first well and thereby having the first concentration of the first conductivity type. The second transistor further comprises a first source/drain ($110_1$) and a second source/drain ($110_2$), both comprising a second conductivity type complementary of the first conductivity type and formed within the second well.

15 Claims, 5 Drawing Sheets

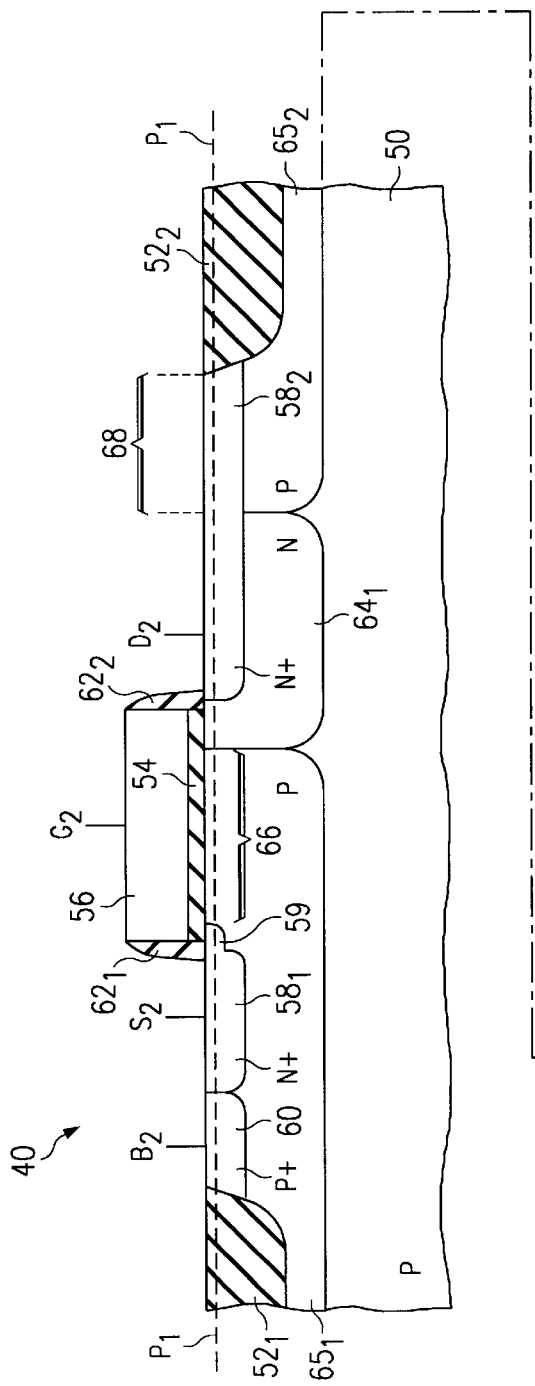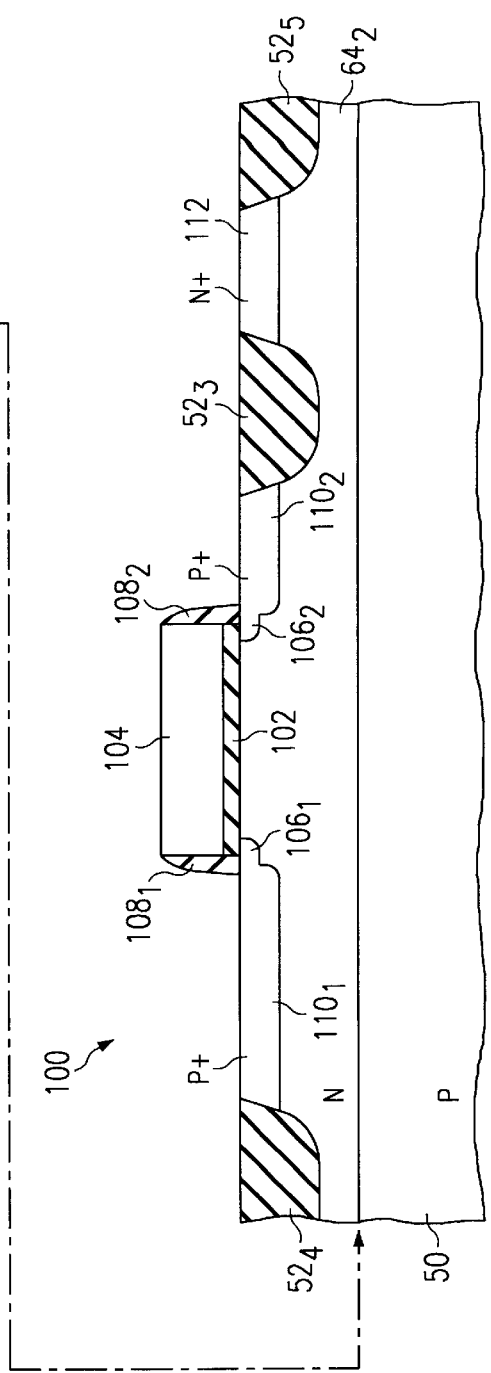
FIG. 2a

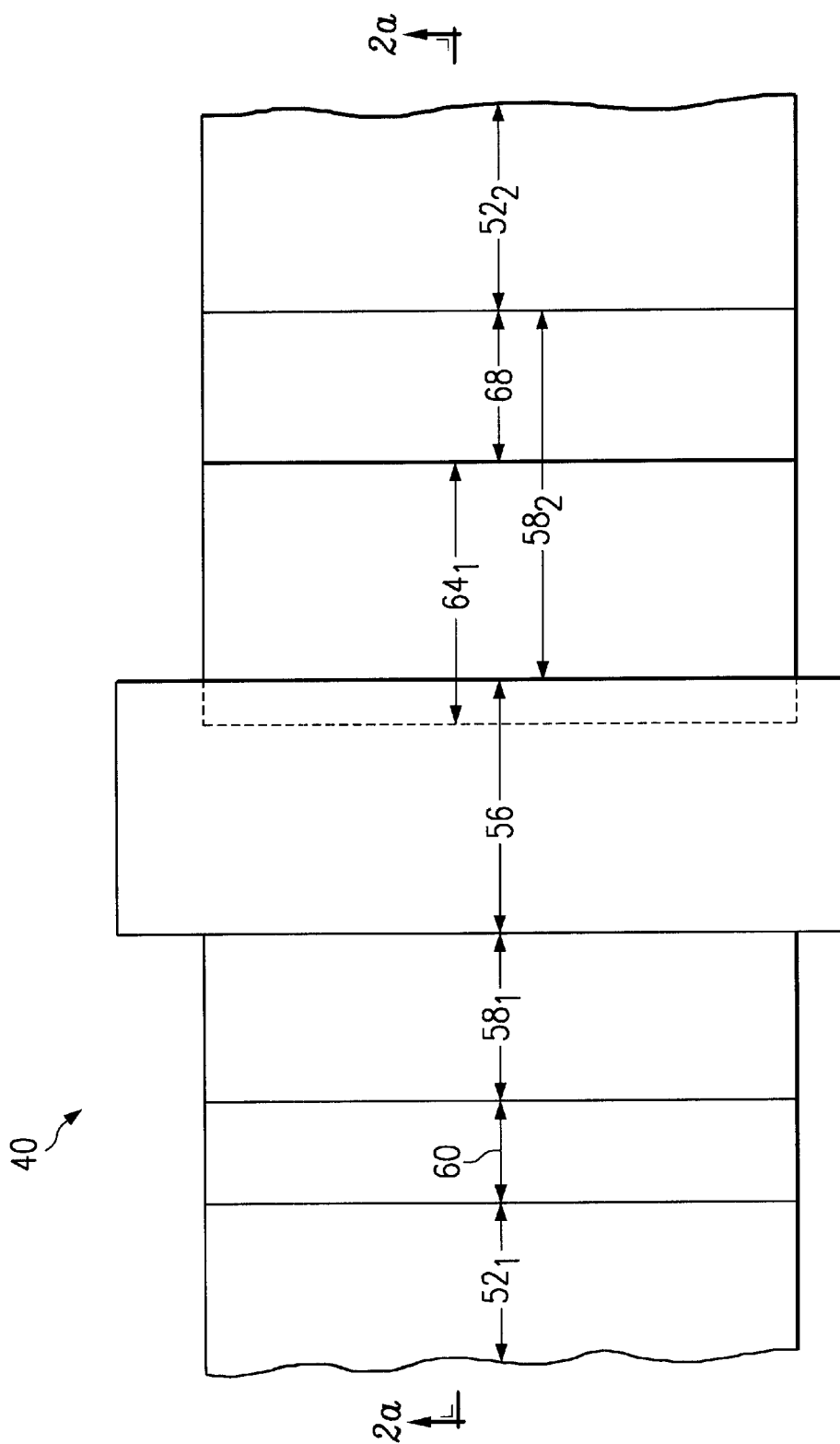

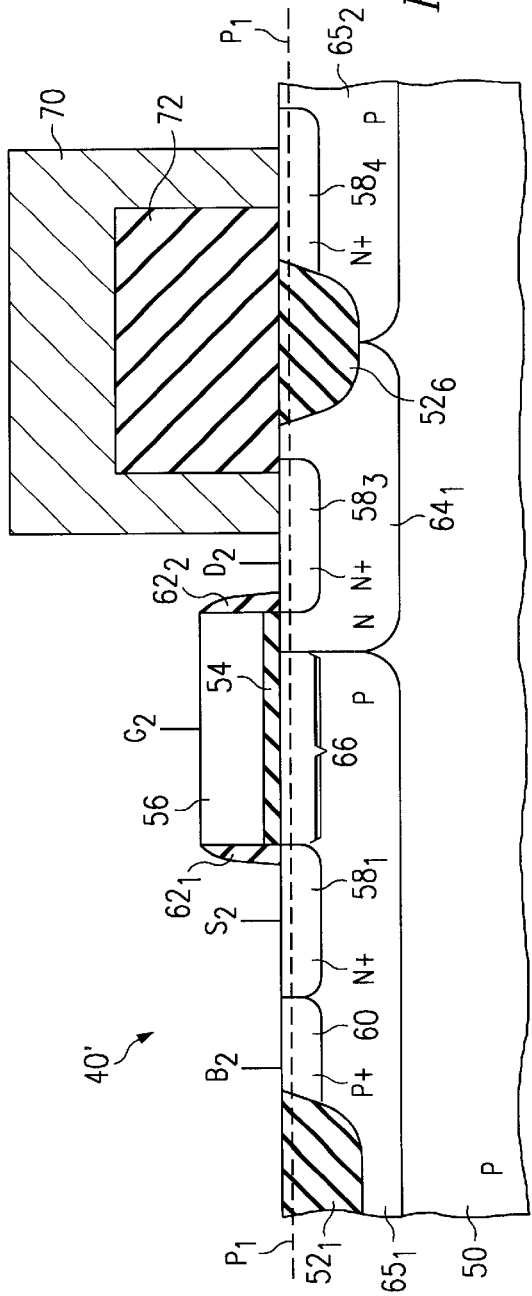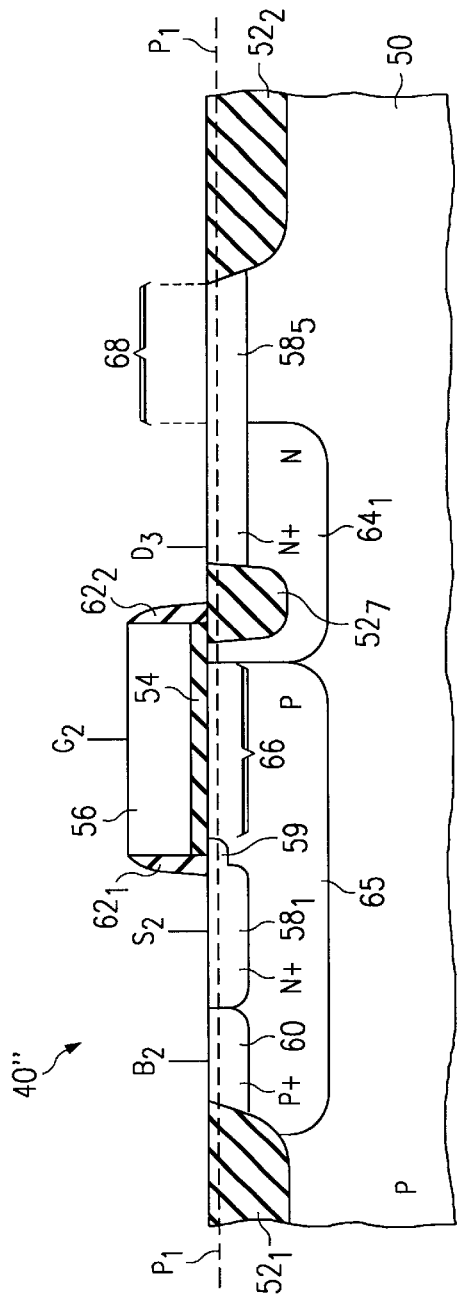

ELECTROSTATIC DISCHARGE RESISTANT EXTENDED DRAIN METAL OXIDE SEMICONDUCTOR TRANSISTOR

This application claims priority under 35 USC §119(e)(1) of provisional application Serial No. 60/250,234, filed Nov. 30, 2000.

CROSS-REFERENCES TO RELATED APPLICATIONS

Not Applicable.

STATEMENT REGARDING FEDERALLY SPONSORED RESEARCH OR DEVELOPMENT

Not Applicable.

BACKGROUND OF THE INVENTION

The present embodiments relate to electronic circuits and are more particularly directed to an extended drain metal oxide semiconductor ("MOS") transistor having a configuration for enhanced electrostatic discharge ("ESD") protection.

Semiconductor devices have become prevalent in all aspects of electronic circuits, and the design of such devices often involves a choice from various circuit elements such as one or more of different transistor devices. For example, drain extended MOS ("DEMOS") transistors are used in various circuits, where one instance is a circuit that has different operating voltages. Such a circuit may include two different operating voltages, where a first voltage is used at the input/output ("I/O") level while a second and lower voltage is used for the operational core of the circuit. In these cases, transistors suitable for use at the higher I/O voltages are required, and one type of such a transistor is the DEMOS transistor. DEMOS transistors also may be used in applications where the voltage on the drain exceeds the normal voltage rating of the gate oxide.

While DEMOS transistors have found beneficial use in certain circuit implementations, another aspect of device design is device reliability. For example, one common cause of concern to the reliability of a circuit is potential damage from ESD. ESD occurs due to a relatively short period of relatively high voltage or current imposed on the device. For example, ESD can be caused by the human body, by poorly grounded machinery such as test equipment, or in electrically noisy environments as may be incurred in automotive applications or in consumer applications, including computers. In any event, due to the risk of ESD, devices are often engineered and tested to ensure that they can withstand certain levels of ESD. In this regard, the present inventor has determined that while DEMOS transistors may prove useful such as described above and particularly for use at the I/O level of a circuit, a standard DEMOS configuration may be unreliable for certain levels of ESD, as further detailed later.

By way of further background, U.S. Pat. No. 5,627,394 ("the '394 Patent"), is entitled LD-MOS transistor, and issued May 6, 1997. The '394 Patent describes an LD (lateral diffusion) transistor designed to increase device breakdown strength. The transistor includes a highly-doped source region separated from a highly-doped drain region, but further includes a very lightly doped extended drain region in contact with the highly-doped drain region. Of note, the very lightly doped extended drain region is formed by implanting dopants at a level between $3.0 \times 10^{12}$ to $5.0 \times 10^{12}/cm^2$. The present inventor expects that such a light doping causes the lightly doped extended drain region to completely deplete when the transistor is in its off state, thereby rendering that region in effect an insulator during that time, whereas, when the device is on the light doping level will conduct, but will provide a considerable resistance thereby limiting current flow through the transistor. Additionally, the '394 Patent notes that the use of this structure eliminates the need for an n-well to be formed below the highly-doped drain region.

In view of the above, there arises a need to improve upon the prior art as is achieved by the preferred embodiments described below.

BRIEF SUMMARY OF THE INVENTION

In the preferred embodiment, there is a semiconductor device comprising a first transistor and a second transistor, both formed in a semiconductor substrate. The first transistor comprises a gate conductor and a gate insulator separating the gate conductor from a semiconductor material and defining a channel area in the semiconductor material opposite from the gate conductor. The first transistor further comprises a source comprising a first doped region of a first conductivity type and adjacent the channel area. Further, the first transistor comprises a drain. The drain comprises a first well adjacent the channel area and having a first concentration of the first conductivity type and a first doped region portion and a second doped portion. The first doped portion has a second concentration of the first conductivity type. The second concentration is greater than the first concentration and the first doped region portion has a common interface with the first well. The second doped region portion has the second concentration of the first conductivity type, wherein the second doped region portion has no common interface with the first well and is not adjacent the channel area. The second transistor comprises a second well formed using a same implant step as the first well and thereby having the first concentration of the first conductivity type. The second transistor further comprises a first source/drain and a second source/drain, both comprising a second conductivity type complementary of the first conductivity type and formed within the second well. Other attributes are also disclosed and claimed.

BRIEF DESCRIPTION OF THE SEVERAL VIEWS OF THE DRAWING

FIG. 2a illustrates a cross-sectional view of a first preferred embodiment of a DEMOS transistor 40 and a contemporaneously-formed standard PMOS transistor 100.

FIG. 3 illustrates a plan view of transistor 40 from FIG. 2a to depict one possible layout for that transistor, with the cross-sectional view in FIG. 2a being taken along line 2a in FIG. 3.

FIG. 5 illustrates a cross-sectional view of another preferred embodiment of a DEMOS transistor 40'.

FIG. 6 illustrates a cross-sectional view of another preferred embodiment of a DEMOS transistor 40".

DETAILED DESCRIPTION OF THE INVENTION

Figure 1:
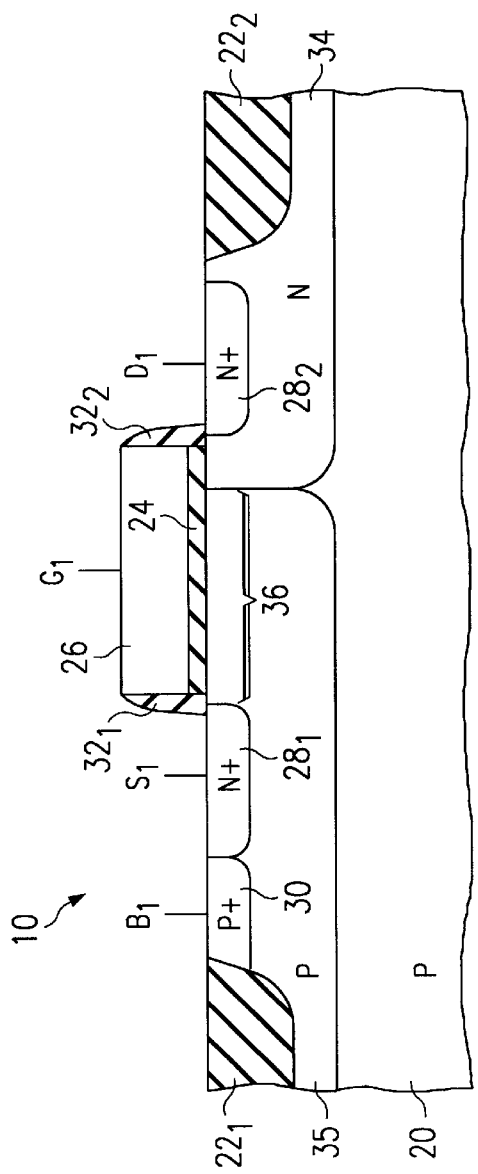
FIG. 1 illustrates a cross sectional view of a prior art DEMOS transistor 10.

By way of additional introduction to the prior art beyond that discussed in the earlier Background Of The Invention section of this document, FIG. 1 illustrates a cross-sectional view of a prior art DEMOS transistor 10. DEMOS transistor 10 is formed using a substrate 20 which, in the example of FIG. 1, is formed from a p-type semiconductor material and is therefore labeled with a "P" designation. Two shallow trench isolation ("STI") regions $22_1$ and $22_2$ are formed in substrate 20 and may be various insulating materials such as silicon oxide or silicon nitride. A gate dielectric 24 is formed over substrate 20, and it may be an oxide, a thermally grown silicon dioxide, a nitride, an oxynitride, or a combination of these or other insulators. A gate conductor 26 is formed over gate dielectric 24, such as by forming a layer of conductive material which is patterned and etched to form gate conductor 26. Further, gate conductor 26 is typically formed from polysilicon, although other materials may be used. For the sake of reference, gate conductor 26 is also shown by a schematic indication in FIG. 1 with the identifier "$G_1$." Two doped regions $28_1$ and $28_2$ are formed within substrate 20 and are self-aligned with respect to the sidewalls of gate conductor 26. In the present example, regions $28_1$ and $28_2$ are n-type regions. Generally, regions $28_1$ and $28_2$ may be structurally the same and thus both are sometimes referred to as source/drain regions; however, for the sake of reference, in FIG. 1 region $28_1$ is considered to provide the source of transistor 10 and is schematically labeled "$S_1$" and region $28_2$ is considered to provide in part the drain of transistor 10 and is schematically labeled "$D_1$." An additional doped region 30 is formed adjacent to, and with an opposite conductivity type relative to, doped region $28_1$; thus, doped region 30 in the example of FIG. 1 is a p-type doped region. Doped region 30 is considered the body contact of the transistor and, therefore, is schematically labeled "$B_1$." Further, insulating sidewalls $32_1$ and $32_2$ are formed along the sidewalls of gate conductor 26.

To complete the description of the components of DEMOS transistor 10 as shown in FIG. 1, note that typically a dual-well process is used to form many sub-micron CMOS circuits and it also is used to form DEMOS transistor 10. In this process, at one time one or more n-well regions are formed within substrate 20, where PMOS transistors are typically then formed within those n-well regions; however, additional PMOS transistors along with their corresponding n-well regions are not shown in FIG. 1 to simplify the Figure. Nonetheless, in the example of FIG. 1, one of these n-wells is shown as n-well 34 and is formed prior to the formation of gate conductor 26, although additional NMOS transistors along with their corresponding p-well regions are not shown to simplify the Figure. From the perspective of FIG. 1, it may be appreciated that n-well 34 is located such that doped region $28_2$ is enclosed within n-well 34. Thus, the drain $D_1$ of transistor 10 is provided by both doped region $28_2$ and n-well 34. Further, the doping concentration of n-well 34 is relatively lower than that of doped-region $28_2$ and, for this reason, FIG. 1 includes an "N" designation on n-well 34 while an "N+" designation (i.e., higher n-dopant concentration) is shown on doped region $28_2$ (and also on doped region $28_1$). Also as part of the dual-well process, at one time one or more p-well regions are formed within substrate 20, where NMOS transistors are typically then formed within those p-well regions. In the example of FIG. 1, one of these p-wells is shown as p-well 35 and is formed prior to the formation of gate conductor 26. From the perspective of FIG. 1, it may be appreciated that p-well 35 is located such that doped region $28_1$ is enclosed within p-well 35. The doping concentration of p-well 35 is relatively lower than that of doped-region 30 and, for this reason, FIG. 1 includes a "P" designation on p-well 35.

The normal operation of DEMOS transistor 10 is well-known in the art. Generally, substrate 20 may be biased by applying a potential to body $B_1$, which is conducted by doped region 30 and p-well 35 to substrate 20. Further, a positive gate-to-source potential, as applied between $G_1$ and $S_1$, will allow current to flow from drain $D_1$ and along a channel area 36 that is generally beneath gate dielectric 24 and between doped region $28_1$ and n-well 34.

While the operation of DEMOS transistor 10 under normal circumstances has proven sufficient in many circumstances, the present inventor has observed a drawback in that DEMOS transistor 10 may not withstand various ESD events. Particularly, in order to absorb an ESD event, the MOS transistor must be triggered into a parasitic bipolar mode of operation at a low enough voltage so that the power dissipation when passing a standard ESD current level (e.g., 5 mA/micrometer) will not damage the transistor. Looking to FIG. 1, therefore, an NPN bipolar mode of operation may be achieved from the drain $D_1$ acting as an n-type collector, to semiconductor substrate 20 and p-well 35 acting as a p-type body, to the source $S_1$ acting as an n-type emitter. However, it has been observed by the present inventor that due to the relative light doping of n-well 34 and its structural relationship to doped region $28_2$, then the breakdown voltage of the device increases and the actual location of the breakdown is likely to occur somewhere inside n-well 34 and more particularly along the interface between doped region $28_2$ and n-well 34. This has led to destruction of the device, such as by melting of the silicon, rather than properly absorbing the ESD energy.

FIG. 2a illustrates a cross-sectional view of a DEMOS transistor 40 according to a first preferred embodiment and which is preferably used as an I/O transistor, and FIG. 2a further illustrates a PMOS transistor 100 constructed at the same time as transistor 40, but where PMOS transistor 100 is preferably used as a core transistor. By way of introduction, the components of DEMOS transistor 40 in some respects resemble those of prior art DEMOS transistor 10 described above, and the reader is assumed familiar with the earlier discussion; further, various materials used to form some of the components of transistor 40 also may be the same as those of transistor 10 and, therefore, such materials are not re-stated in detail. Also by way of introduction, PMOS transistor 100 is constructed in general according to prior art techniques for forming PMOS transistors, where it is included however to illustrate one aspect of the preferred embodiment as it relates to a favorable n-well formation step, as further appreciated below.

Turning to DEMOS transistor 40, it is formed using a substrate 50 which, in the example of FIG. 2a, is a p-type semiconductor material. Note also that a p-type well may be used in place of a p-type substrate for the implementation of transistor 40. Two STI regions $52_1$ and $52_2$ are formed in substrate 50. A gate dielectric 54 is formed over substrate 50, and a gate conductor 56 is formed over gate dielectric 54. For the sake of reference, gate conductor 56 is also shown by a schematic indication in FIG. 2a with the identifier "$G_2$."

Turning to transistor 100, it is formed also using substrate 50. Three STI regions $52_3$, $52_4$, and $52_5$, are formed in substrate 50. In a manner detailed considerably below, an n-well $64_2$ is formed within substrate 50 and between STI regions $52_4$ and $52_5$. A gate dielectric 102 is formed over substrate 50, and a gate conductor 104 is formed over gate dielectric 102. Two p-type lightly doped diffused regions $106_1$ and $106_2$ are formed self-aligned with respect to the sidewalls of gate conductor 104, after which insulating sidewalls $108_1$ and $108_2$ are formed along the sidewalls of gate conductor 104. Next, two p-type heavily-doped p-type regions $110_1$ and $110_2$, labeled generally with a P+ designation due to their relatively large doping, are formed within n-well $64_2$ and are self-aligned with respect to insulating sidewalls $108_1$ and $108_2$ (and, hence, also to sidewalls of gate conductor 104). Lastly, a heavily-doped n-type doped region 112 is formed between STI regions $52_3$ and $52_5$ to provide electrical contact to n-well $64_2$ and it is labeled with an N+ designation due to its relatively high doping.

Returning to transistor 40, a distinction arises between it and the prior art of FIG. 1 with respect to the structural configuration of doped regions. Specifically, in transistor 40, two doped regions $58_1$ and $58_2$ are formed within substrate 50 and are vertically self-aligned with respect to the sidewalls of gate conductor 56 (or insulators thereon), but as further detailed below region $58_2$ structurally differs from its prior art counterpart in FIG. 1. Once more, however, and by way of example, regions $58_1$ and $58_2$ are n-type regions, and preferably are formed using a doping concentration on the order of $5 \times 10^{15}/cm^2$. In addition, an n-type lightly-doped diffused ("LDD") region 59 is formed in electrical communication with n-type region $58_1$, such as by a self-aligning implant after gate conductor 56 is formed and prior to the formation of sidewall insulators. For the sake of reference in FIG. 2a, regions $58_1$ and 59 are considered to provide the source of transistor 40 and together are schematically labeled "$S_2$" while region $58_2$ is considered to provide in part the drain of transistor 40 and is schematically labeled "$D_2$." An additional doped region 60 is formed adjacent and with an opposite conductivity type relative to doped region $58_1$; thus, doped region 60 in the example of FIG. 2a is a p-type doped region. Doped region 60 is the body contact of transistor 40 and, therefore, is schematically labeled "$B_2$." Further, insulating sidewalls $62_1$ and $62_2$ are formed along the sidewalls of gate conductor 56.

In the preferred embodiment, DEMOS transistor 40 is also typically constructed in connection with a dual-well process used to form other CMOS devices using the same substrate 50, where such other devices include, by way of example, PMOS transistor 100. Thus, in this process, one or more n-well regions are formed within substrate 50 at a single time such that each n-well has a same depth in substrate 50 and where PMOS transistors are typically then formed within those n-well regions. In the example of FIG. 2a, a first of these n-wells is n-well $64_2$ of PMOS transistor 100. However, also in the example of FIG. 2a, an additional one of these n-wells is shown as an n-well $64_1$ to be used for the inventive transistor 40 rather than for a standard PMOS transistor, and n-well 64 is formed prior to the formation of gate conductor 56. From the perspective of FIG. 2a, one skilled in the art may appreciate that n-well $64_1$ electrically communicates with n-type doped region $58_2$; thus, the drain $D_2$ of transistor 40 is provided by both doped region $58_2$ and n-well $64_1$. Further, and for reasons further elaborated upon later, the doping concentration used to form n-wells $64_1$ and $64_2$ is preferably on the order of $1 \times 10^{13}/cm^2$ or greater, such as $4 \times 10^{13}/cm^2$ or $5 \times 10^{13}/cm^2$. As a particular advantage of the preferred embodiment, note therefore that the same parameters (e.g., doping concentration, energy level, temperature, timing) used to form n-well $64_1$ as well as comparable wells for other devices like transistor 40 also may be used to form other n-wells, such as n-well $64_2$, in which standard PMOS devices will be formed; In other words, in the preferred embodiment no additional step is required to form n-well $64_1$ apart from the other n-wells that are commonly formed on a CMOS device. Further, because this doping concentration is relatively lower than that of doped-region $58_2$, then FIG. 2a includes an "N" designation on n-wells $64_1$ and $64_2$ while an "N+" designation (i.e., higher n-dopant concentration) is shown on doped region $58_2$ (and also on doped region $58_1$).

Also as part of a dual-well process, at one time one or more p-well regions are formed within substrate 50, where standard NMOS transistors may be formed within those p-well regions (although such p-well regions in connection with standard NMOS devices are not shown in FIG. 2a to simplify the Figure). In the example of FIG. 2a, an additional two of these p-wells are at the same time formed with respect to transistor 40 and are shown as p-wells $65_1$ and $65_2$. From the perspective of FIG. 2a, it may be appreciated that p-well $65_1$ is located such that doped regions $58_1$ and 59 are enclosed within p-well $65_1$. The implant doping concentration used to form p-wells $65_1$ and $65_2$ is on the order of $4 \times 10^{13}/cm^2$ or $5 \times 10^{13}/cm^2$ and, thus, is, relatively lower than that of doped-region 60; for this reason, FIG. 2a includes a "P" designation on p-wells $65_1$ and $65_2$.

The typical operation of DEMOS transistor 40 is as follows. Substrate 50 may be biased by applying a potential to body $B_2$, which is conducted by doped region 60 and p-well $65_1$ to substrate 50. Further, a positive gate-to-source potential, as applied between $G_2$ and $S_2$, will allow current to flow from drain $D_2$ and along a channel area 66 that is generally beneath gate dielectric 54 and between LDD region 59 and n-well $64_1$. Further in this regard, note that due to the preferable doping levels of doped regions $58_1$, 59, and $58_2$, as well as that of n-well $64_1$, a desirable level of current flow may be obtained during regular operation in an environment using gate voltages on the order of 10 volts or less.

Given the description thus far of n-well $64_1$ and doped region $58_2$, two observations may be made with respect to the structural relationship of those two regions in the preferred embodiment and where these observations give rise to a later appreciation of the strength of transistor 40 in an ESD event. Specifically, as seen in the perspective of FIG. 2a, as a first observation note that doped region $58_2$ is not fully enclosed by n-well $64_1$. More particularly and as a second observation, note that doped region $58_2$ is aligned along an imaginary plane $P_1$ shown as a dashed line in FIG. 2a and which passes through transistor channel area 66 and to doped region $58_1$ (and also to doped region 60), and along plane $P_1$ doped region $58_2$ includes a protrusion 68 that is not in contact with n-well $64_1$. Instead, protrusion 68 directly contacts the same conductivity type of semiconductor material in which doped region $58_1$ is formed, that is, in the preferred embodiment protrusion 68 directly contacts a p-type material. Thus, doped region $58_2$ includes two portions, a first portion having a common interface with n-well $64_1$ and a second a portion which is protrusion 68 and which does not share a common interface with n-well $64_1$. Instead, protrusion 68 is in contact with the p-type p-well $65_2$ and extends in a direction that is not adjacent to channel area 66 under gate conductor 56, that is, protrusion 68 is not immediately next to channel area 66. The benefits arising from this preferred embodiment construction are discussed below.

Figure 2B:
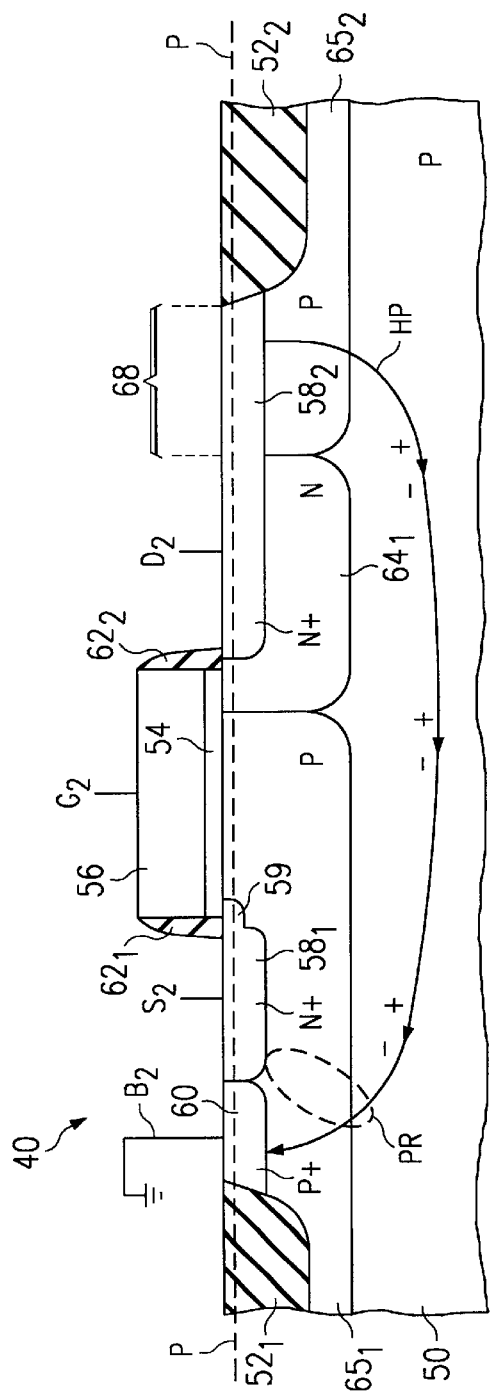
FIG. 2b illustrates the cross-sectional view of DEMOS transistor 40 from FIG. 2a with the addition of an illustration of a hole path to enable a bipolar mode of operation during an ESD event.

FIG. 2b again illustrates the perspective of transistor 40 from FIG. 2a, but to further demonstrate the benefits of transistor 40 additional aspects are shown. Specifically, according to the preferred embodiment, when an ESD event occurs, and with body $B_2$ grounded as shown, the avalanche breakdown of drain $D_2$ occurs at a point shown by the beginning of a hole path HP. Thus, from FIG. 2b it may be seen that the breakdown point, that is, the beginning of hole path HP, occurs somewhere along protrusion 68. Thus, unlike the FIG. 1 prior art, in response to an ESD event the preferred embodiment does not break down along the interface between n-well $64_1$ and doped region $58_2$. Instead, as a result of the preferred embodiment breakdown location, holes may diffuse from protrusion 68 of drain $D_2$ directly into p-well $65_2$ and substrate 50 and along hole path HP, and the holes may further pass to p-type region 60, by way of p-well $65_1$, which provides body $B_2$. Moreover, the holes along path HP create a potential region PR that forward biases the p/n junction between p-well $65_1$ and the n-type doped region $58_1$. As a result of the holes, therefore, a lateral NPN transistor is created, with the first junction being the between n-type doped region $58_2$ and the p-type p-well $65_2$ and the second junction being between p-well $65_1$ and the n-type doped region $58_1$. In view of the preceding, the preferred embodiment encourages the avalanche breakdown to occur along portion 68, thereby enabling a lateral NPN transistor. This lateral transistor is therefore able to absorb the ESD energy.

Having illustrated the preferred embodiment, an additional observation may be made with respect to the location of the breakdown along protrusion 68 in response to an ESD event. Specifically, because protrusion 68 has a larger doping concentration than n-well $64_1$ and because the preferred embodiment effectively moves the location of the breakdown to the interface between protrusion 68 and p-well $65_2$, then the actual breakdown voltage should be lower than that of a configuration such as transistor 10 of the prior art using comparable doping levels. As a result, the lower breakdown voltage associated with the preferred embodiment should reduce the likelihood of damage to transistor 40 in response to an ESD event.

Still another benefit of the preferred embodiment arises when transistor 40 is implemented as an I/O transistor on a circuit having different transistor characteristics for its I/O transistors versus its core transistors, as is commonly the case in contemporary circuits where, by way of example, the core transistors may operate at a lesser voltage than the I/O transistors such as discussed in the Background Of The Invention section of this document. In such an embodiment, the core transistors typically include source/drain regions that use two implants, a first for forming an LDD portion extending under the transistor gate, and a second implant forming the remainder of the source/drain region extending away from the transistor channel (shown, by way of example, as transistor 100 in FIG. 2a). In connection with transistor 40, the same implant step used to form the n-type LDD portions for the core transistors also may be used to form n-type LDD region 59 of transistor 40 in the I/O circuit. Thus, there is no need for an additional and different implant step to form n-type LDD region 59 beyond that already provided for in constructing the core transistors. In addition, no LDD region is formed in connection with drain $D_2$ of transistor 40, because the effective lighter doping of drain $D_2$ is achieved in connection with n-well $64_1$, and that well is preferably created at the same time as are other n-wells that will be required to construct p-type devices in a CMOS architecture. As a result, this elimination of additional patterning and related steps may be estimated to be a ten percent cost savings on a typical 20 pattern process flow used for dual voltage integrated circuits.

FIG. 3 illustrates a plan view of transistor 40 from FIG. 2a to depict one possible layout for that transistor in an approximate sense, with the cross-sectional view in FIG. 2a being taken along line 2a in FIG. 3 and with a few simplifications made in that insulating sidewalls $62_1$ and $62_2$ are not shown and STI regions $52_1$ and $52_2$ are shown only to the sides of the Figure whereas in actuality they will surround the device on all sides. From FIG. 3, one skilled in the art may appreciate the location of gate conductor 56, with doped region $58_1$ self-aligned with respect to the left sidewall of gate conductor 56 and with n-well $64_1$ located to the right of gate conductor 56 and partially extending under gate conductor 56. Additionally, the plan view of FIG. 3 depicts how doped region $58_2$ extends in one direction toward the right sidewall of gate conductor 56, while doped region $58_2$ also includes a protrusion 68 that extends beyond n-well $64_1$ in the direction away from the transistor channel underlying gate conductor 56. Lastly, FIG. 3 also illustrates doped region 60 as well as STI regions $52_1$ and $52_2$.

Figure 4:
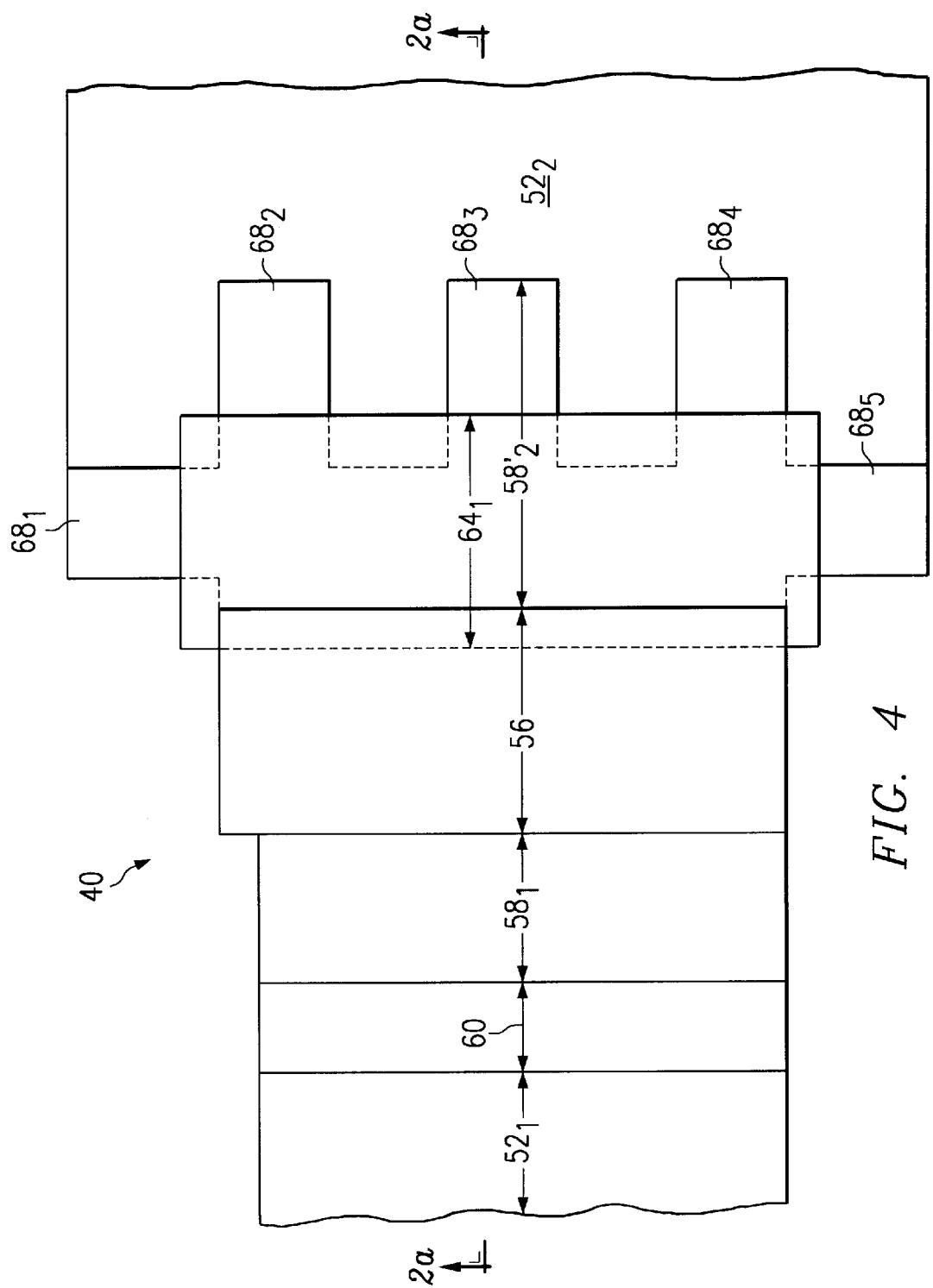
FIG. 4 illustrates a plan view of an alternative embodiment of transistor 40 from FIG. 2a to depict a different layout for that transistor.

FIG. 4 illustrates a plan view of an alternative embodiment of transistor 40 from FIG. 2a to depict a different layout for that transistor, where again the cross-sectional view in FIG. 2a is taken along line 2a in FIG. 4, but where one change exists in that the protrusion of doped region $58_2$ along line 2a in FIG. 4 is labeled $68_3$. More particularly, FIG. 4 demonstrates that various alternative protrusion configurations may be constructed according to the present inventive teachings by re-shaping doped region $58_2$ to include any one or more of what is shown as five different alternative protrusions $68_1$ through $68_5$ while the remaining components in FIG. 4 generally may be the same as in FIG. 3. For example, each of protrusions $68_2$, $68_3$, and $68_4$ extends along plane $P_1$ (see FIG. 2a) and are co-linear with an imaginary line, such as line 2a in FIG. 4, defined between doped region $58_1$, channel area 66, and n-well $64_1$, where protrusion $68_3$ lies along such a line while protrusions $68_2$ and $68_4$ are parallel with such a line. In contrast, each of protrusions $68_1$ and $68_5$ extends in a direction that is perpendicular to such a line.

For any of protrusions $68_1$ through $68_5$, they represent a portion of doped region $58_2$ that extends along the plane $P_1$ (see FIG. 2a) and in a position that is not immediately adjacent the transistor channel which is beneath gate conductor 56, and they also extend so that they do not have a common interface with n-well $64_1$. As a result, during operation of the transistor shown in FIG. 4 and more particularly during an ESD event, a breakdown should occur in any one or more of protrusions $68_1$ through $68_5$ rather than along an interface within n-well $64_1$. Consequently, in the same manner shown in FIG. 2b, holes may travel along a path from the protrusion(s) to doped region 60, thereby enabling a lateral NPN bipolar transistor to absorb the ESD energy.

FIG. 5 illustrates a cross-sectional view of a second preferred embodiment of a DEMOS transistor 40'. DEMOS transistor 40' includes many of the same components as DEMOS transistor 40 of FIG. 2a and, thus, for these same components the same reference numbers are carried forward from FIG. 2a to FIG. 5. The differences of transistor 40' with respect to transistor 40 are illustrated to the right side of FIG. 5; specifically, transistor 40' again includes n-well $64_1$, but it fully encloses an N+ doped region $58_3$, that is, in this respect the structural relationship between the lighter doped n-well $64_1$ and the more heavily doped region $58_3$ may be the same as shown in FIG. 1. However, transistor 40' also includes an additional doped region $58_4$ that is preferably formed along plane $P_1$ away from channel area 66 and not in physical contact with n-well $64_1$ but instead in contact with p-well $65_2$, and with the same doping as doped region $58_3$ (e.g., high concentration n-type). Within p-well $65_2$, doped region $58_4$ is physically separated from doped region $58_3$, such as by STI region $52_6$ as illustrated in FIG. 5. However, transistor 40' also includes a conductor 70, formed by way of example through an insulator 72 (which could be formed over the remainder of transistor 40'), electrically connecting the separate doped regions $58_3$ and $58_4$ to one another. Thus, by virtue of the electrical connection achieved by conductor 70, drain $D_2$ of transistor 40' includes two portions, a first which is doped region $58_3$ that has a common interface with n-well $64_1$ and a second which is doped region $58_4$ which does not have a common interface with n-well $64_1$.

Given the construction of transistor 40' as well as the operational description of the various preferred embodiments described above, one skilled in the art should readily appreciate that transistor 40' also permits ESD energy to be absorbed while reducing the chance of a voltage breakdown along the interface between n-well $64_1$ and doped region $58_3$. Specifically, with body $B_2$ of transistor 40' grounded, and assuming a large voltage or current is imposed on drain $D_2$, then a hole path will commence from doped region $58_4$ toward body $B_2$. Further, and in a comparable manner as illustrated in FIG. 2b, for transistor 40' a potential region is created by the hole path that is proximate the p/n junction between p-well $65_1$ and the n-type doped region $58_1$, thereby forward biasing that region and allowing transistor 40' to absorb the ESD event.

FIG. 6 illustrates a cross-sectional view of a third preferred embodiment of a DEMOS transistor 40". DEMOS transistor 40" also includes many of the same components as DEMOS transistor 40 of FIG. 2a and, thus, for these same components the same reference numbers are carried forward from FIG. 2a to FIG. 5. The differences of transistor 40" with respect to transistor 40 are illustrated to the right side of FIG. 6; specifically, transistor 40" includes a third STI region $52_7$ formed partially under gate conductor 56. As known in the DEMOS art, such a formation allows a greater amount of voltage to be dropped across the added thickness of insulator provided by STI region $52_7$ proximate gate conductor 56, thereby reducing the risk of a short-circuit through gate dielectric 54. In any event, n-well $64_1$ therefore surrounds STI region $52_7$. In addition, drain $D_3$ of transistor 40" includes a highly-doped n-type region $58_5$, formed at the same time and using the same implant parameters as n-type doped region $58_1$. Region $58_5$ includes two portions, a first portion having a common interface with n-well $64_1$ and a second portion which is protrusion 68 and which does not share a common interface with n-well $64_1$ but contacts p-well $65_2$ and extends in a direction that is not adjacent to channel area 66 under gate conductor 56. Thus, one skilled in the art should readily appreciate that voltage breakdown is encouraged to occur along protrusion 68 in a manner similar to that shown with respect to transistor 40 in FIG. 2b.

From the above, it may be appreciated that the preferred embodiments provide various different ESD resistant DEMOS transistors. Moreover, the preceding teachings have demonstrated various alternatives for such transistors. Still further, various additional embodiments may be formed given the preceding teachings with further variations to the embodiments described above. For example, while FIGS. 2a through 6 depict NMOS transistors, the inventive teachings of this document maybe applied to PMOS transistors. As another example, the transistors shown in cross-section in FIGS. 2a, 2b, 5, and 6 could include additional components or connections such as through the use of additional layers and processing steps. As still another example of the inventive scope, the inventive transistors described above may be located in various locations in a circuit; for example, such a transistor may be used at the input/output level of a circuit, such as connecting the transistor to a bond pad of the circuit where it is more likely to incur an ESD event. Indeed, in such an implementation the same transistor used to drive the output could implement the preceding teachings so as to defend the circuit from an ESD event, or different transistors may be used such that one provides the output driving function while another is included to specifically increase robustness in case of an ESD event. Thus, from all of the preceding teachings one skilled in the art will appreciate that while the present embodiments have been described in detail, various substitutions, modifications or alterations could be made to the descriptions set forth above without departing from the inventive scope which is defined by the following claims.

What is claimed is:

1. A semiconductor device, comprising:
    a first transistor formed in a semiconductor substrate, comprising:
        a gate conductor;
        a gate insulator separating the gate conductor from a semiconductor material and defining a channel area in the semiconductor material opposite from the gate conductor;
        a source comprising a first doped region of a first conductivity type and adjacent the channel area;
        a drain comprising:
            a first well adjacent the channel area and having a first concentration of the first conductivity type;
            a first doped region portion having a second concentration of the first conductivity type, wherein the second concentration is greater than the first concentration and wherein the first doped region portion has a common interface with the first well; and
            a second doped region portion having the second concentration of the first conductivity type, wherein the second doped region portion has no common interface with the first well and is not adjacent the channel area; and
    a second transistor formed in the semiconductor substrate, comprising:
        a second well formed using a same implant step as the first well and thereby having the first concentration of the first conductivity type;
        a first source/drain comprising a second conductivity type complementary of the first conductivity type and formed within the second well; and
        a second source/drain comprising the second conductivity type and formed within the second well.

2. The semiconductor device of claim 1 wherein the drain comprises a single second doped region comprising both the first doped region portion and the second doped region portion.

3. The semiconductor device of claim 2 wherein both the first doped region portion and the second doped region portion are aligned an imaginary plane that further is aligned with the first doped region and the channel area.

4. The semiconductor device of claim 1 wherein the first doped region portion and the second doped region portion are formed as separate physical regions, and further comprising a conductor electrically connecting the first doped region portion with the second doped region portion.

5. The semiconductor device of claim 4 wherein both the first doped region portion and the second doped region portion are aligned an imaginary plane that further is aligned with the first doped region and the channel area.

6. The semiconductor device of claim 1 and further comprising a body doped region of the second conductivity type.

7. The semiconductor device of claim 6:
wherein the first conductivity type comprises n-type; and
wherein the second conductivity type comprises p-type.

8. The semiconductor device of claim 6 and further comprising a third well of the second conductivity type, wherein the second doped region portion is formed in and directly contacts the third well.

9. The semiconductor device of claim 1 wherein the first conductivity type comprises n-type.

10. The semiconductor device of claim 1 wherein the first conductivity type comprises p-type.

11. The semiconductor device of claim 1 wherein the first well and the second well have a like depth.

12. The semiconductor device of claim 1 wherein the second doped region portion is co-aligned along an imaginary line that extends through the first doped region and the channel area.

13. The semiconductor device of claim 1 wherein the second doped region portion is perpendicular to an imaginary line that extends through the first doped region and the channel area.

14. The semiconductor device of claim 1 and further comprising a third well of the second conductivity type, wherein the second doped region portion is formed in and directly contacts the third well.

15. The semiconductor device of claim 1 and further comprising a bond pad, and wherein one of either the source and the drain is electrically connected to the bond pad.

* * * * *